United States Patent
Chu

(10) Patent No.: US 8,052,852 B2
(45) Date of Patent: Nov. 8, 2011

(54) MAGNETRON SPUTTERING CATHODE MECHANISM

(75) Inventor: Guan-Yeu Chu, Taichung (TW)

(73) Assignee: Wintek Corporation, Taichung (TW)

( * ) Notice: Subject to any disclaimer, the term of this patent is extended or adjusted under 35 U.S.C. 154(b) by 495 days.

(21) Appl. No.: 12/255,062

(22) Filed: Oct. 21, 2008

(65) Prior Publication Data

US 2009/0127107 A1  May 21, 2009

(30) Foreign Application Priority Data

Nov. 15, 2007  (TW) ................................ 96143292 A

(51) Int. Cl.
*C23C 14/35*  (2006.01)
(52) U.S. Cl. .................................. 204/298.12
(58) Field of Classification Search ............. 204/298.12
See application file for complete search history.

(56) References Cited

U.S. PATENT DOCUMENTS

| 4,204,936 A * | 5/1980 | Hartsough ............... 204/192.12 |
| 5,286,361 A * | 2/1994 | Makowiecki et al. ... 204/298.12 |
| 2009/0120783 A1* | 5/2009 | Eschendorff ............. 204/192.12 |

* cited by examiner

*Primary Examiner* — Keith Hendricks
*Assistant Examiner* — Jenny Wu
(74) *Attorney, Agent, or Firm* — Thomas, Kayden, Horstemeyer & Risley, LLP

(57) ABSTRACT

A magnetron sputtering cathode mechanism includes a backing plate, a target, at least one magnetic component and at least one magnet. The backing plate has a first surface and a second surface opposite to the first surface. The first surface has at least one positioning recess, and the target has a bombarded surface and a non-bombarded surface opposite to the bombarded surface. The non-bombarded surface contacts with the first surface and has at least one combining recess. The magnetic component is disposed between the backing plate and the target and has a combining portion and a positioning portion. The combining portion is positioned in the combining recess, and the positioning portion is received in the positioning recess. The magnet is disposed at the second surface. The magnetic component is attracted to the corresponding magnet so as to fix the target at the backing plate.

11 Claims, 6 Drawing Sheets

MAGNETRON SPUTTERING CATHODE MECHANISM

This application claims the benefit of Taiwan application Serial No. 096143292, filed Nov. 15, 2007, the subject matter of which is incorporated herein by reference.

BACKGROUND OF THE INVENTION

1. Field of the Invention

The invention relates in general to a magnetron sputtering cathode mechanism, and more particularly to a magnetron sputtering cathode mechanism using a magnetic component to combine a target and a backing plate together and heighten the magnetic field to be close to a bombarded surface of the target.

2. Description of the Related Art

In the mechanical, electronic or semiconductor industry, in order to provide a specific feature to materials for being further used, a thin film is formed on surfaces of the materials by various methods. The sputtering method, which can be applied to the surface treatment of decorations, dining utensils, knives, tools, molds and semiconductor elements, is one of the most popular methods at present. The sputtering method is generally referred to a process of forming a thin film with the same or different materials on surfaces of various metal materials, hard alloys, ceramic materials and wafers so as to obtain elegant, wearproof, heat-resistant and corrosion-resistant features.

A magnetron sputtering apparatus, which can be adopted in various research fields, such as the electric machinery field, the mechanism field, the electronics field, the optics field or the material field, is a device for implementing the thin film sputtering process. The magnetron sputtering apparatus is based on the ion beam sputtering theory. When positive ions accelerated by the electrical filed impact a target bombarded surface, atoms and molecules of the target bombarded surface eject from the target bombarded surface after exchanging the kinetic energy with the high energy positive ions. This phenomenon is called "sputtering."

The electrical filed is used in the magnetron sputtering apparatus to generate electrons between two electrodes. The accelerated electrons collide with inert gas (such as argon (Ar)) filled in the coating chamber in advance, so that the inert gas carries positive charges. The ions carrying the positive charges are attracted by the cathode in the magnetron sputtering apparatus to collide with the atoms of the target bombarded surface. The atoms obtain the kinetic energy from the incident ions because of being collided with the positive ions, so that the atoms under the target bombarded surface are forced to move. The displacement of several layers of the atoms under the target bombarded surface generates a reaction force perpendicular to the target bombarded surface to collide the atoms located at the target bombarded surface, so that the atoms scatter out. The scattered atoms (also collide with the neutral Ar atoms in the way to render the Ar atoms carry positive charges) eventually deposit on the substrate (the anode) to form a thin film. A set of magnets is added into the magnetron sputtering apparatus. The electron movement would be affected by the electromagnetic force generated by the electromagnetic effect between the magnetic field and the electrical field. If the magnetic direction is perpendicular to the electrical direction, the movement distance of the electrons lengthens as the electrons move in a spiral movement. As a result, the additional collision times of the electrons and the inert increase the probability for the inert gas to become the ions with positive charges. Thus, the depositing rate of the thin film increases.

In a magnetron sputtering cathode mechanism of the traditional magnetron sputtering apparatus, the target is usually fixed on the backing plate by using a backing plate bonding mechanism or a clamp holding mechanism. The target is directly adhered on the backing plate through adhesives by using the backing plate bonding mechanism. The way for fixing the target on the backing plate by the clamp holding mechanism will be illustrated with the appended figures in the following.

Referring to FIGS. 1A~1B, a top view and a lateral cross-sectional view of a traditional magnetron sputtering cathode mechanism are illustrated, respectively. As shown in FIGS. 1A~1B, the magnetron sputtering cathode mechanism includes a backing plate 11, a target 12, at least one magnet 14 and at least one clamp 15. The target 12 is held on the front surface of the backing plate 11 by the clamp 15, so that a bombarded surface of the target 12 faces backward the backing plate 11. The clamp 15 is fixed on the backing plate 11 or the cathode by the cooperation between its own hole and a screw. The magnet 14 disposed at a back surface of the backing plate 11 is used for providing a magnetic field.

However, the backing plate bonding mechanism and the clamp holding mechanism adopted in the described traditional magnetron sputtering cathode mechanism have shortcomings as follows:

1. When the target is changed by using the backing plate bonding mechanism, the backing plate with the remaining target has to be removed from the cathode. Then, another backing plate to which a new target is adhered is installed on the cathode. As a result, the installation is time-consuming and complicated.

2. As the backing plate on the cathode has to be usually changed by the backing plate bonding mechanism, the leak probability of the vacuum chamber is increased due to the installation defects. In addition, the leak detect has to be performed every time after the backing plate is changed.

3. While the backing plate bonding mechanism is used, the equipment and the process for bonding the target are used firstly to debond the remaining target from the backing plate and are used afterwards to bond a new target on the available backing plate.

4. While the backing plate bonding mechanism is used, more backing plates have to be prepared for bonding with the target except the backing plate installed on the cathode. Therefore, the equipment cost increases.

5. For the clamp holding mechanism, the manufacturing cost and the difficulty of maintaining and cleaning the clamp increase if the materials of the target and the clamp are the same (such as the process adopted ceramic materials to be the material of the target).

6. For the clamp holding mechanism, the deposited thin film is polluted by the bombarded clamp if the material of the clamp is aluminum or stainless steel metal which has lower manufacturing cost and is easy to clean and maintain.

7. For the clamp holding mechanism, as the deposited thin film polluted by the bombarded clamp is taken into the consideration, the bombarded area of the target is disposed away from the clamp when the cathode and the magnetic field are designed. Thus, a bombarded area of the target becomes narrow, so that the depositing rate is reduced and the dimension of the substrate is shrunk concurrently.

8. For the clamp holding mechanism, as the bombarded area of the target becomes narrow, the utilization rate of the target reduces.

9. For the clamp holding mechanism, screws are generally used to fix the clamp at the backing plate or the cathode, and it is not easy to well control the screws to be fastened tightly or loosely. If the screws are fastened too tightly, the target may be broken due to the heat expansion. If the screws are fastened too loosely, the target and the backing plate are ill-contacted, so that the heat within the target fails to transfer to the backing plate for cooling the target.

10. While the backing plate bonding mechanism or the clamp holding mechanism is used, the magnet is located under the backing plate. Thus, the distribution of the magnetic field above the target is not well and the magnetic field is weak, hence it is not easy to effectively control the electrons to collide with the inert gas.

SUMMARY OF THE INVENTION

The invention is directed to a magnetron sputtering cathode mechanism, a target of which is processed, so that an end of a magnetic component cooperated with the target is fixed at the target. A recess is formed at a backing plate corresponding to a magnetic area on a magnetron cathode, so that the other end of the magnetic component can be inserted into the recess located on the backing plate to be attracted by the magnet so as to install the target on the backing plate. Thus, compared with using the backing plate bonding mechanism, the target of the magnetron sputtering cathode mechanism according to the invention is easier to install and with lower cost. In addition, the clamp holding mechanism dose not need to be used in the magnetron sputtering cathode mechanism according to the invention, so that the consideration of the possibility of the clamp being bombarded by positive ions can be omitted. As a result, a bombarded area of the target can be increased so as to increase the deposition speed and the utilization rate of the target. Furthermore, the magnetic component disposed between the target and the backing plate heightens the magnetic field to be close to a bombarded surface of the target, so the distribution and the intensity of the magnetic filed can be improved.

According to the present invention, a magnetron sputtering cathode mechanism including a backing plate, a target, at least one magnetic component and at least one magnet is provided. The backing plate has a first surface and a second surface opposite to the first surface. The first surface has at least one positioning recess, and the target has a bombarded surface and a non-bombarded surface opposite to the bombarded surface. The non-bombarded surface has at least one combining recess. The magnetic component is disposed between the backing plate and the target and has a combining portion and a positioning portion. The combining portion is received in the combining recess of the target, and the positioning portion is received in the positioning recess of the backing plate. The magnet is disposed at the second surface of the backing plate, and the magnetic component is attracted to the corresponding magnet so as to fix the non-bombarded surface of the target at the first surface of the backing plate Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 2A:
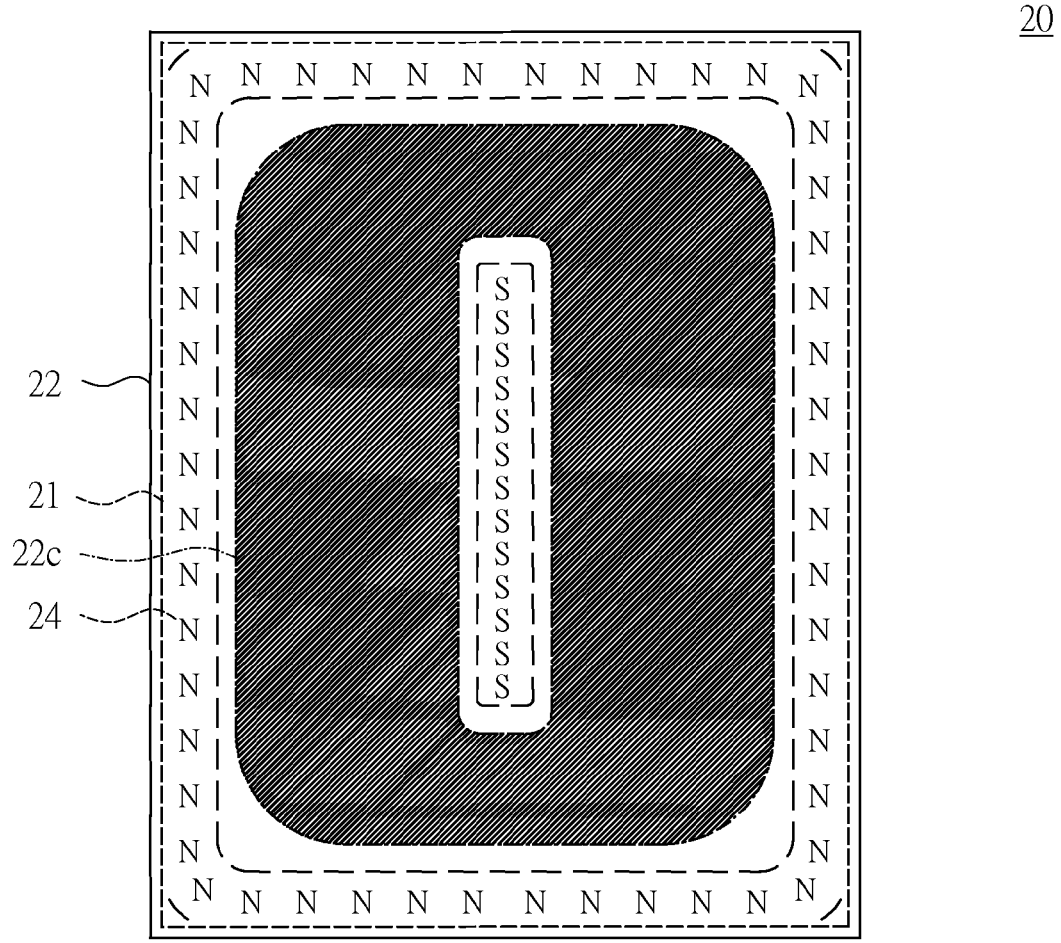
FIGS. 2A~2B are a top view and a lateral cross-sectional view of a magnetron sputtering cathode mechanism according to a first embodiment of the present invention, respectively.
Figure 2B:
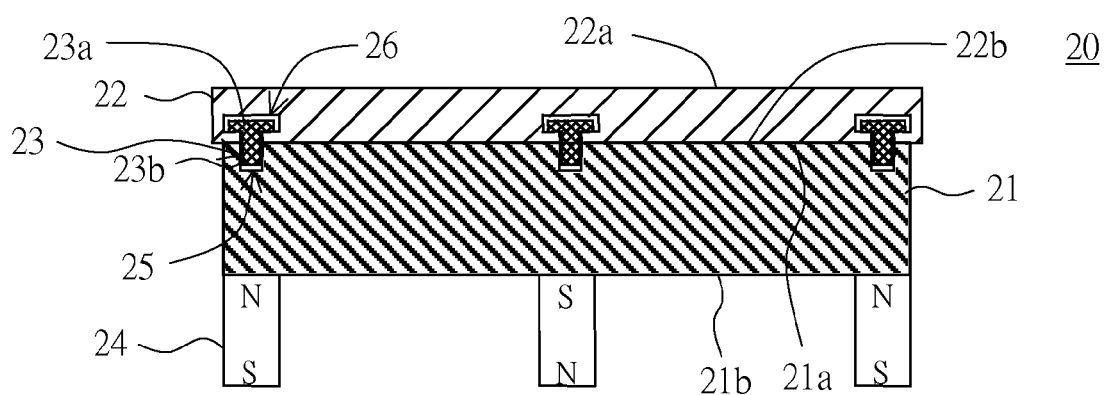

Referring to FIGS. 2A~2B, a top view and a lateral cross-sectional view of a magnetron sputtering cathode mechanism according to a first embodiment of the present invention are illustrated, respectively. As shown in FIGS. 2A~2B, the magnetron sputtering cathode mechanism 20 can be disposed in a magnetron sputtering apparatus and includes a backing plate 21, a target 22, at least one magnetic component 23 and at least one magnet 24. The backing plate 21 has a first surface 21a and a second surface 21b opposite to the first surface 21a. The first surface 21a has at least one positioning recess 25. A surface of the target 22 facing backward the backing plate 21 is used as a bombarded surface 22a, and the opposite surface of the target 22 is used as a non-bombarded surface 22b. The non-bombarded surface 22b has at least one combining recess 26, and the target 22 can be any target adopted in the magnetron sputtering process.

Figure 2C:
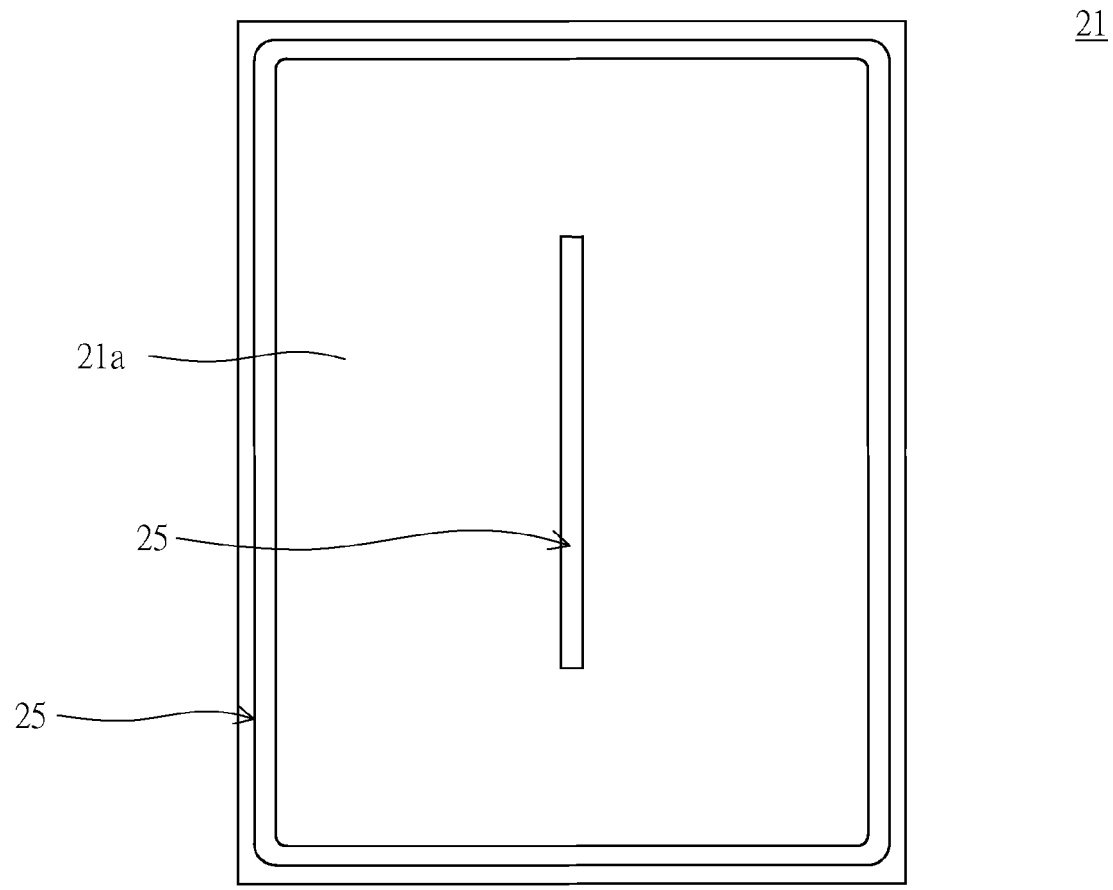
FIG. 2C is a bottom view of the backing plate in FIG. 2A.

As shown in FIG. 2B, the magnetic component 23 is disposed between the backing plate 21 and the target 22 and has a combining portion 23a and a positioning portion 23b. Referring to FIG. 2C, a bottom view of the backing plate in FIG. 2A is illustrated. As shown in FIG. 2C, the positioning recess 25 of the backing plate 21 is formed as a closed annular shape recess surrounding the edge of the first surface 21a and a strip shape recess at a central area. Magnets with a closed annular shape disposition surround the edge of the second surface 21b and magnets with a strip shape disposition is located at a central area of the second surface 21b. The combining portion 23a and the positioning portion 23b of the magnetic component 23 respectively insert into the combining recess 26 of the target 22 and the positioning recess 25 of the backing plate 21 so as to position the target 22 at the backing plate 21. The magnetic component 23 is attracted to the magnet 24 by the magnetism, so that the target 22 is stably combined with the backing plate 21 through the magnetic component 23.

Figure 2D:
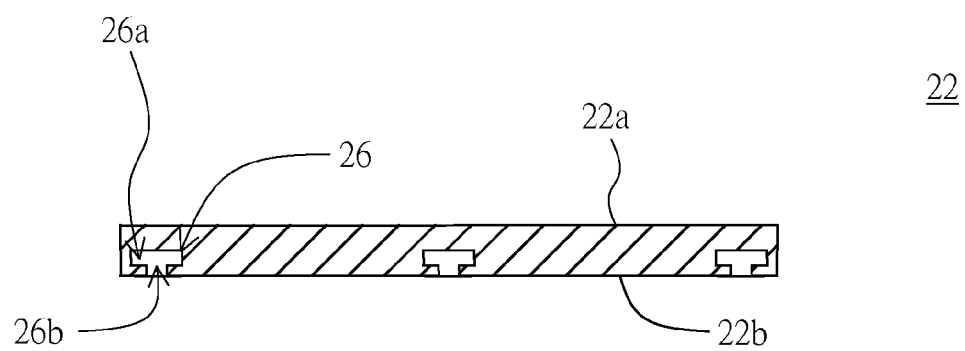
FIG. 2D is a cross-sectional view of the target in FIG. 2B.

Referring to FIG. 2C and FIG. 2D at the same time, FIG. 2D is a cross-sectional view of the target in FIG. 2B. In order to correspond to the closed annular shape positioning recess 25 and the central strip shape positioning recess 25 of the backing plate 21, the combining recess 26 of the target 22 is formed as a closed annular shape structure and a strip shape structure at the center. The cross section of the combining recess 26 is formed as a T shape to have a wide recess 26a at the wide portion and a narrow recess 26b at the vertical location.

In addition, the magnetic component 23 can be magnetic materials, such as iron, cobalt (Co), nickel (Ni) or an alloy thereof, or a magnet. The magnetic component 23 shown in the figures is a T-shaped structure, so that a portion of the magnetic component 23 is a wider combining portion 23a and the other portion of that is a narrow positioning portion 23b. Therefore, the combining portion 23a is disposed in the wide recess 26a of the target 22, and the positioning portion 23b is inserted into the positioning recess 25 of the backing plate 21. In addition, the magnetic component 23 is attracted to the magnets 24 so as to combine the backing plate 21 and the target 22 together.

Figure 1A:
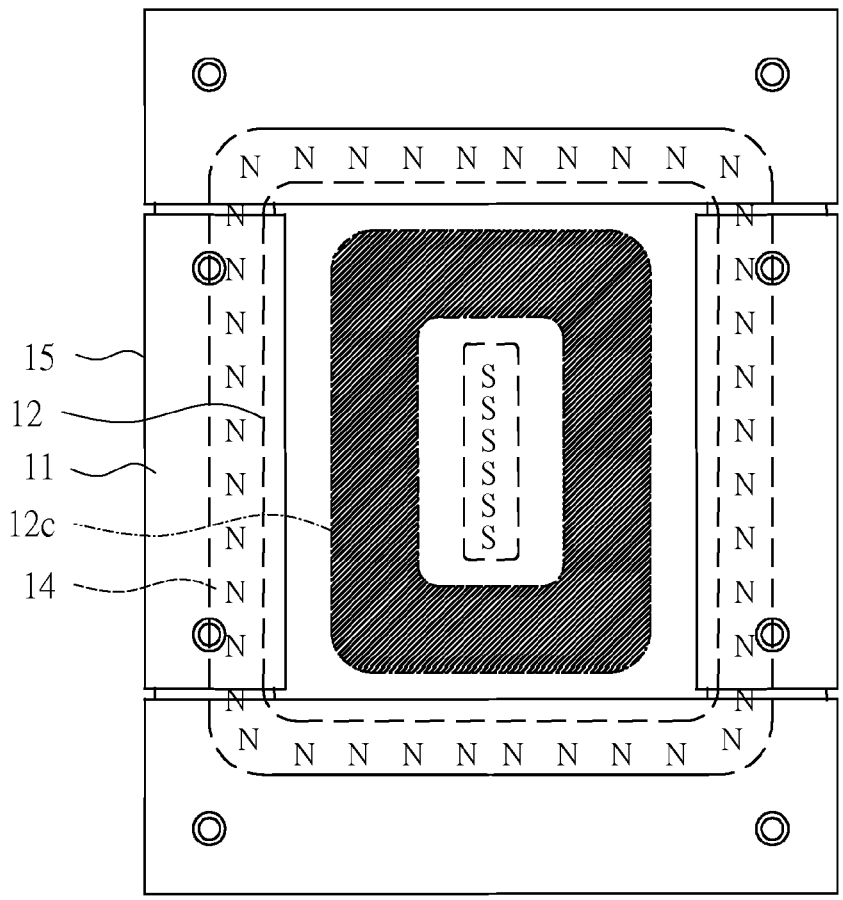
FIGS. 1A~1B (Prior Art) are a top view and a lateral cross-sectional view of a traditional magnetron sputtering cathode mechanism, respectively.
Figure 1B:
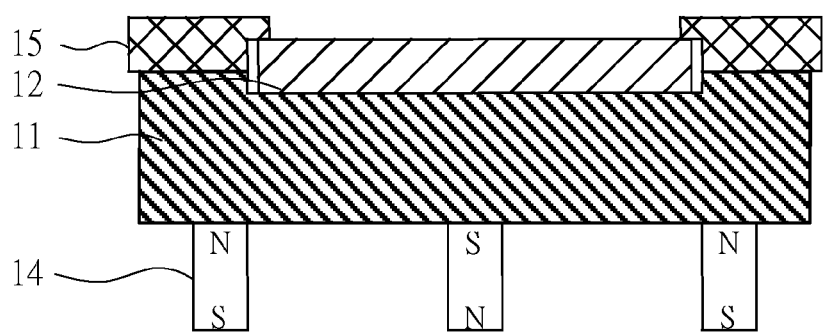

As shown in FIG. 2B, as the magnetic component 23 of the present embodiment is disposed between the backing plate 21 and the target 22, the bombarded surface 22a of the target 22 is not occupied. Therefore, as shown in FIG. 2A, a bombarded area 22c of the target 22 is greatly larger than a bombarded area 12c of the traditional target 12 in FIG. 1A. In addition, the deposition speed of the magnetron sputtering cathode mechanism can be increased, and the dimension of a to-be-deposited substrate on the anode in the magnetron sputtering cathode mechanism can be increased concurrently.

However, the techniques of the present invention are not limited thereto. The positioning recess can be designed to be composed of several independent recesses, for example, three recesses, which are respectively located at the right side, the left side and the central area of the first surface of the backing plate. The combining recess on the target can also be correspondingly designed to be composed of three independent recesses which are respectively located at the right side, the left side and the central position of the non-bombarded surface of the target with respect to the positioning recess of the backing plate.

Figure 3A:
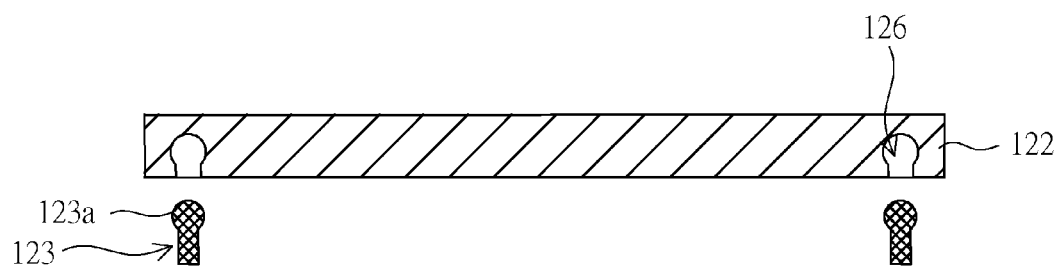
FIG. 3A shows the combination of a second type magnetic component and a target.

As to the longitudinal cross section design of the combining portion of the magnetic component, the longitudinal cross section of the combining portion can be Y-shaped or other shapes except T-shaped. Referring to FIG. 3A, the combination of a second type magnetic component and a target is shown. A combining portion 123a of a magnetic component 123 is designed to be circular, and a combining recess 126 of a target 122 is correspondingly designed to be circular, so that the structure interference can be formed between the combining portion 123a and the combining recess 126.

Figure 3B:
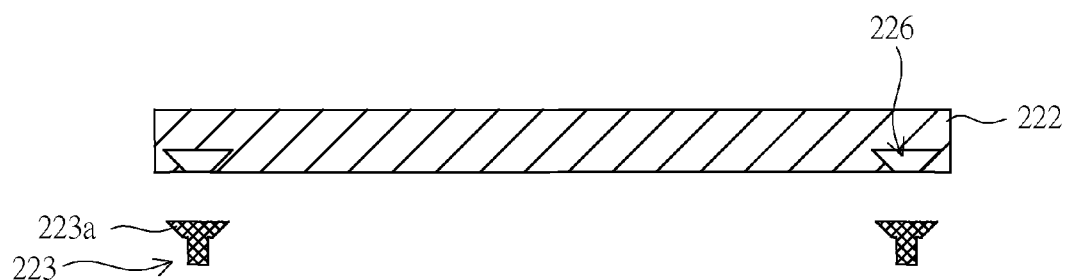
FIG. 3B shows the combination of a third type magnetic component and a target.

Referring to FIG. 3B, the combination of a third type magnetic component and a target is shown. A combining portion 223a of a magnetic component 223 is designed to be dovetail-shaped, and a combining recess 226 of a target 222 is correspondingly designed to be dovetail-shaped, so that the structure interference can be formed between the combining portion 223a and the combining recess 226. However, the present invention is not limited thereto. The combining portion of the magnetic component can be designed to be semicircular, egg-shaped, elliptic, sectorial, regular polygonal, non-regular polygonal, any other regular or irregular shape, and the shape of the combining recess of the target is designed to correspond to the shape of the combining portion of the magnetic component as well.

As shown in FIG. 2B, the north pole (N pole) and the south pole (S pole) of the magnet 24 located at an edge area of the second surface 21b of the backing plate 21 can be toward and away from the magnetic component 23, respectively. The south pole and the north pole of the magnet 24 located at the central area of the second surface 21b of the backing plate 21 is toward and away from the magnetic component 23, respectively. Therefore, according to the design of the described location and polarity arrangement of the magnet 24, a magnetic filed is provided between the magnets 24 to increase the deposition efficiency.

Under the presupposition that the target 22 can be combined on the backing plate 21 through the magnetic component 23, the magnetron sputtering cathode mechanism 20 of the embodiment can also be implemented without the magnetic component 23 located at the central location. In addition, the positioning recess 25 at the central area of the backing plate 21 and the combining recess at the central area of the target 22 can be omitted as well.

Second Embodiment

Figure 4A:
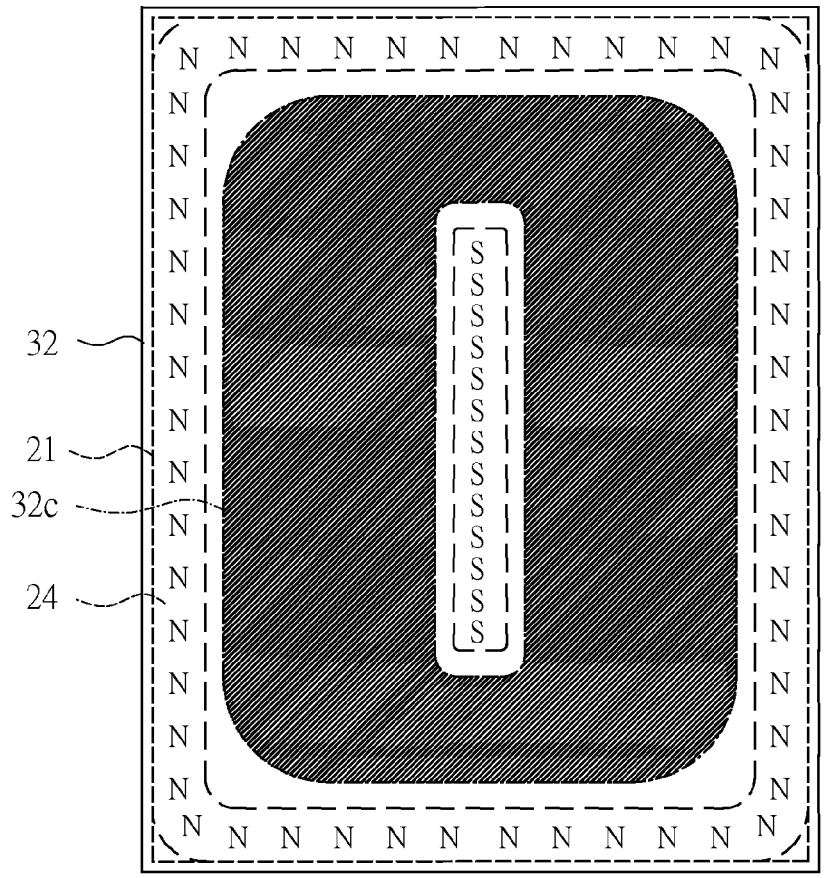
FIGS. 4A~4B are a top view and a lateral cross-sectional view of a magnetron sputtering cathode mechanism according to a second embodiment of the present invention, respectively.
Figure 4B:
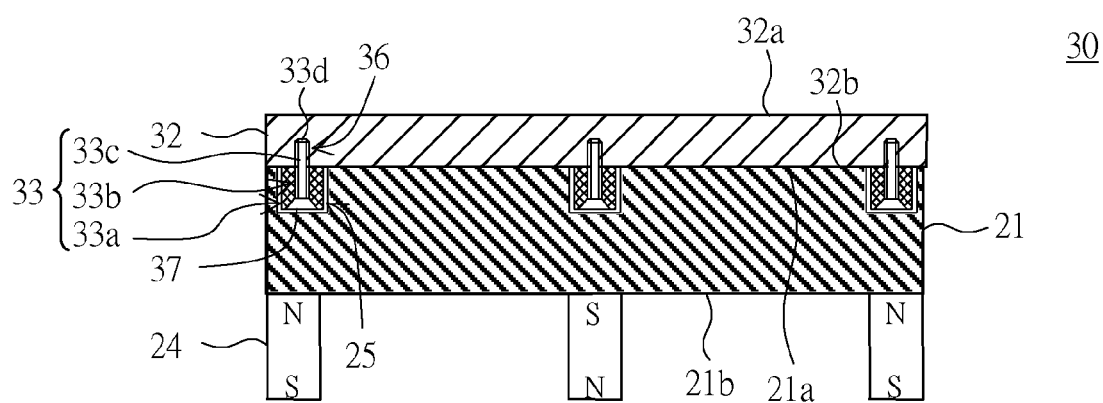
Figure 4C:
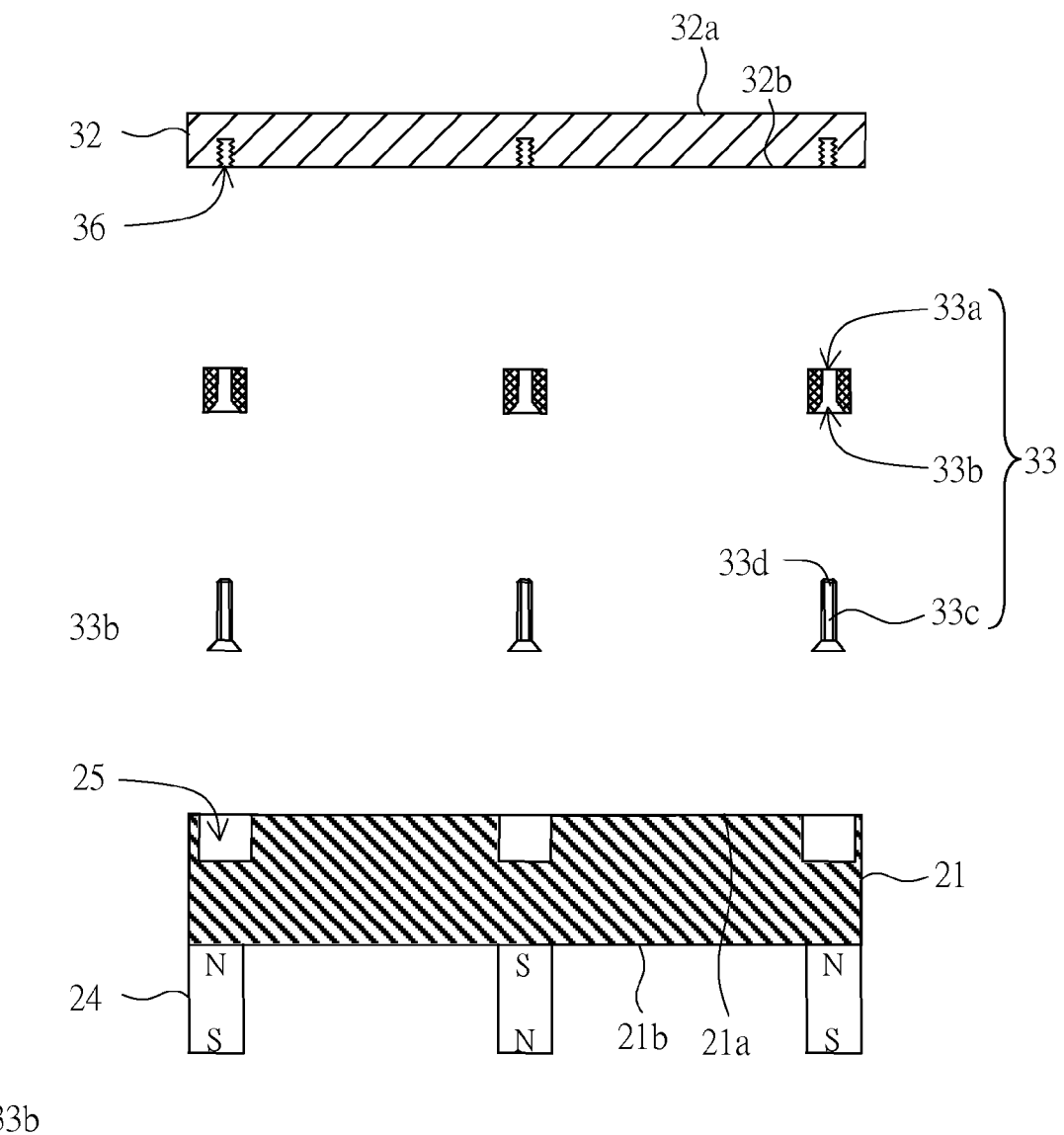
FIG. 4C is an exploded view of FIG. 4B.

Referring to FIGS. 4A~4C, a top view and a lateral cross-sectional view of a magnetron sputtering cathode mechanism according to a second embodiment of the present invention and an exploded view of FIG. 4B are illustrated, respectively. The magnetron sputtering cathode mechanism 30 of the embodiment differs from the magnetron sputtering cathode mechanism 20 (as shown in FIG. 2B) in the combination of a target 32 and a magnetic component 33. The same components are denoted with the same numbers and the connection relationship between the components is not repeatedly described herein.

As shown in FIG. 4B~4C, the target 32 has a bombarded surface 32a and a non-bombarded surface 32b opposite to the bombarded surface 32a. A combining recess of the non-bombarded surface 32b has, for example, a screw hole 36. The target 32 can be any target adopted in the magnetron sputtering process. The magnetic component 33 is disposed between the backing plate 21 and the target 32. The magnetic component 33 includes a bolt 33c and a positioning portion 33a with the magnetism. The positioning portion 33a has a hole 33b, allowing the bolt 33c to pass through the hole 33b, so that an end of the bolt 33c passing through the positioning portion 33a is used as the combining portion 33d. The combining portion 33d is locked at the screw hole 36 of the target, so that the positioning portion 33a is received in the positioning recess 25. Therefore, the positioning portion 33a of the magnetic component 33 and the magnet 24 located at the second surface 21b of the backing plate 21 are attracted to each other so as to position the target 32 at the first surface 21a of the backing plate 21.

According to the described embodiments, the magnetron sputtering cathode mechanism of the present invention indeed solves various problems caused by the traditional magnetron sputtering cathode mechanism. The merits of the invention are stated as follows.

1. As the magnetron sputtering cathode mechanism according to the present invention does not need to change the backing plate while the target is changed, the installation is timesaving and easy.

2. As the target of the magnetron sputtering cathode mechanism according to the present invention is changed without changing the backing plate concurrently, the leak of the vacuum chamber would not occur due to the installation defects. In addition, the leak detect for the magnetron sputtering cathode mechanism is not needed.

3. According to the magnetron sputtering cathode mechanism of the present invention, the backing plate debonding process and the backing plate bonding process for the target are not needed.

4. According to the magnetron sputtering cathode mechanism of the present invention, as the backing plate debonding process and the backing plate bonding process for the target are not performed, a backing plate for the backing plate bonding process does not need to be prepared. Therefore, the equipment cost can be reduced.

5. According to the magnetron sputtering cathode mechanism of the present invention, the clamps for holding the target on the backing plate do not need to be manufactured, so that the manufacturing and maintaining cost of the clamps can be reduced.

6. As the clamps are not used in the magnetron sputtering cathode mechanism according to the present invention, the pollution to the deposited thin film caused by the bombarded clamps can be avoided.

7. As the clamps are not used in the magnetron sputtering cathode mechanism according to the present invention and the pollution to the deposited thin film caused by the bombarded clamp is not taken into consideration, the bombarded area of the target can be widened when the cathode and the magnetic field are designed. Therefore, the depositing rate can be increased, and the dimension of the to-be-deposited substrate is increased concurrently.

8. The bombarded area of the target according to the magnetron sputtering cathode mechanism of the present invention can be widened, so that the utilization rate of the target increases.

9. According to the magnetron sputtering cathode mechanism of the present invention, the screws are not used to combine the clamps and the backing plate or the cathode together. Therefore, the target will not be broken due to heat expansion as the screws are fastened too tightly. On the other hand, the target and the backing plate will not be ill-contacted due to the loose screws which might cause the heat to be restricted within the target without being transferred to the backing plate for cooling the target.

10. Although the magnet of the magnetron sputtering cathode mechanism of the present invention is located at the bottom of the backing plate as well, the magnetic component located between the target and the backing plate heightens the distribution of the magnetic field to be close to the bombarded surface. Therefore, the distribution of the magnetic field above the bombarded surface of the target can be improved, and the intensity of the magnetic field is increased to effectively control the electrons to collide with the inert gas.

According to the magnetron sputtering cathode mechanism disclosed in the above embodiments of the invention, the target is combined on the backing plate through the magnetic component, and the target is attracted onto the backing plate by the magnetism to accomplish the installation of the backing plate. Therefore, various problems caused by adopting the backing plate bonding mechanism and the clamp holding mechanism in the traditional magnetron sputtering cathode mechanism can be avoided. Meanwhile, the magnetic component located between the target and the backing plate heightens the distribution of the magnetic field to be close to the bombarded surface. Thus, the distribution and the intensity of the magnetic field can be improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A magnetron sputtering cathode mechanism, comprising:
    a backing plate having a first surface and a second surface opposite to the first surface, wherein the first surface has at least one positioning recess;
    a target having a bombarded surface and a non-bombarded surface opposite to the bombarded surface, wherein the non-bombarded surface contacts with the first surface of the backing plate and has at least one combining recess;
    at least one magnetic component disposed between the backing plate and the target and having a combining portion and a positioning portion, wherein the combining portion is positioned in the combining recess of the target, and the positioning portion is received in the positioning recess of the backing plate; and
    at least one magnet disposed at the second surface of the backing plate, wherein the at least one magnetic component is attracted to the at least one magnet correspondingly so as to fix the target at the backing plate.

2. The magnetron sputtering cathode mechanism according to claim 1, wherein the at least one magnetic component is iron, cobalt (Co), nickel (Ni) or an alloy thereof.

3. The magnetron sputtering cathode mechanism according to claim 1, wherein the at least one magnetic component is an another magnet.

4. The magnetron sputtering cathode mechanism according to claim 1, wherein the combining recess of the target has a wide recess and a narrow recess, a lateral cross section of the wide recess is larger than a lateral cross section of the narrow recess, and the combining portion and the positioning portion of the at least one magnetic component correspond to the combining recess of the target, so that a lateral cross section of the combining portion is larger than a lateral cross section of the positioning portion.

5. The magnetron sputtering cathode mechanism according to the claim 4, wherein the at least one magnetic component is a T-shaped structure, a Y-shaped structure or a dovetail-shaped structure.

6. The magnetron sputtering cathode mechanism according to claim 1, wherein the longitudinal cross section of the combining portion of the at least one magnetic component is circular, semicircular, egg-shaped, elliptic, sectorial, regular polygonal, non-regular polygonal, and the shape of the combining recess of the target corresponds to the shape of the combining portion, allowing the combining portion of the at least one magnetic component to be positioned in the combining recess of the target.

7. The magnetron sputtering cathode mechanism according to claim 1, wherein the at least one magnetic component is an integrally-formed structure.

8. The magnetron sputtering cathode mechanism according to claim 1, wherein the at least one magnetic component comprises a bolt and the positioning portion is magnetic, the positioning portion has a hole allowing the bolt to pass therethrough so that an end of the bolt passing through the positioning portion is used as the combining portion, the combining portion is locked at a screw hole of the target.

9. The magnetron sputtering cathode mechanism according to claim 1, wherein the positioning recess of the backing plate at least surrounds an edge of the first surface to form a closed annular shape, and the at least one magnet and the combining recess of the target are located with respect to the positioning recess to form closed annular shapes.

10. The magnetron sputtering cathode mechanism according to claim 9, wherein the positioning recess of the backing plate is at least located at a central area to form a strip shape, and the at least one magnet and the combining recess of the target are located with respect to the positioning recess to form strip shapes.

11. The magnetron sputtering cathode mechanism according to claim 1, wherein the positioning recess of the backing plate is at least located at a central area to form a strip shape, and the at least one magnet and the combining recess of the target are located with respect to the positioning recess to form strip shapes.

* * * * *